(12) United States Patent  (10) Patent No.: US 8,050,642 B2
Kim et al.  (45) Date of Patent: Nov. 1, 2011

(54) VARIABLE GAIN AMPLIFIER AND RECEIVER INCLUDING THE SAME

(75) Inventors: Young-Ho Kim, Daejeon (KR); Seok-Bong Hyun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 796 days.

(21) Appl. No.: 12/111,913

(22) Filed: Apr. 29, 2008

(65) Prior Publication Data

US 2009/0137220 A1 May 28, 2009

(30) Foreign Application Priority Data

Nov. 26, 2007 (KR) .................. 10-2007-0120897

(51) Int. Cl.
  H04B 1/06 (2006.01)
  H04B 7/00 (2006.01)
(52) U.S. Cl. ............... 455/234.1; 455/241.1; 330/259
(58) Field of Classification Search ...... 455/232.1–237.1, 455/245.1–253.2; 330/259–260, 270, 290, 330/293, 83, 97
  See application file for complete search history.

(56) References Cited

U.S. PATENT DOCUMENTS

| 4,591,828 | A | * | 5/1986 | Storey | ............ 341/120 |
| 6,169,638 | B1 | * | 1/2001 | Morling | ............ 360/46 |
| 6,992,526 | B2 | * | 1/2006 | Cheng | ............ 330/9 |
| 2003/0169114 | A1 | | 9/2003 | Manapragada et al. | |
| 2006/0017827 | A1 | | 1/2006 | Tani et al. | |
| 2007/0126501 | A1 | | 6/2007 | Kim et al. | |
| 2007/0164823 | A1 | | 7/2007 | Hsieh et al. | |

FOREIGN PATENT DOCUMENTS

| KR | 100648379 B1 | 11/2006 |
| KR | 1020070037952 A | 4/2007 |
| KR | 1020070097937 A | 10/2007 |

OTHER PUBLICATIONS

Jianhong Xiao, et al. "*A High Dynamic Range CMOS Variable Gain Amplifier for Mobile DTV Tuner*" IEEE Journal of Solid-State Circuits, vol. 42, No. 2, Feb. 2007.

* cited by examiner

*Primary Examiner* — Christian A Hannon

(57) ABSTRACT

Provided are a variable gain amplifier and a receiver including the same. The variable gain amplifier includes: a gain controller generating a gain control voltage; a variable gain amplifier amplifying an input signal and a feedback signal by using a voltage gain that is linearly proportional to the gain control voltage, and converting the amplified signal into a predetermined magnitude of a signal; and an offset canceller removing an offset from an output signal of the variable gain amplifier and outputting the offset removed result as the feedback signal. The variable gain amplifier includes a plurality of operational transconductance amplifiers.

11 Claims, 7 Drawing Sheets

VARIABLE GAIN AMPLIFIER AND RECEIVER INCLUDING THE SAME

CROSS-REFERENCE TO RELATED APPLICATIONS

This U.S. non-provisional patent application claims priority under 35 U.S.C. §119 of Korean Patent Application No. 10-2007-120897, filed on Nov. 26, 2007, the entire contents of which are hereby incorporated by reference.

BACKGROUND OF THE INVENTION

The present invention disclosed herein relates to a variable gain amplifier capable of automatically adjusting the magnitude of a signal, and more particularly, to a variable gain amplifier having a high dynamic range and a receiver including the same.

The present invention has been derived from research undertaken as a part of IT R & D program of the Ministry of Information and Communication and Institution of Information Technology Association (MIC/IITA) [2005-S-017-03], Integrated development of ultra low power RF/HW/SW SoC.

In various application fields such as disk drivers, hearing aids, medical equipment, and optical receivers, a variable gain amplifier (VGA) is an indispensable device block. Especially, the VGA is required to provide a high gain in order to reduce noise in a low signal power while signal environments are exposed to noise, and also to provide a low gain in order not to worsen distortion when a receiving signal is inputted at the maximum power, in a mobile communication system. To this end, the VGA needs to have a high dynamic range in which a variable gain range is possible. Only so, a digital signal processor (DSP) can stably demodulate a received signal to an original signal.

The VGA using a bipolar junction transistor (BJT) with characteristics of an exponential function is typically used to provide a voltage gain of a decibel (dB) unit, which is proportional to a control voltage. However, because of demands for a complementary metal oxide semiconductor (CMOS) system-on-chip (SoC) and circuit technology developments, the VGA having characteristics of an exponentially linear gain is currently realized as a CMOS device. However, because this CMOS VGA requires a plurality of device blocks to achieve characteristics of an exponentially linear gain, its structure becomes very complex and requires high power consumption. Most of all, the CMOS VGA, because it is a high gain amplifier, is extremely vulnerable if design variables change during manufacturing processes, and thus its design value characteristics can be sensitively changed and greatly deteriorated. Moreover, although a chip of the CMOS VGA can be perfectly realized, frequency or gain characteristics can be deteriorated when a chip temperature changes.

SUMMARY OF THE INVENTION

The present invention provides a CMOS VGA having characteristics of an exponentially linear gain and capable of providing a high linear dynamic range, and a receiver including the same.

The present invention also provides a CMOS VGA having a simple structure and low power consumption, and a receiver including the same.

The present invention also provides a CMOS VGA having stable characteristics with respect to process or temperature changes.

Embodiments of the present invention provide variable gain amplifiers including: a gain controller generating a gain control voltage; a variable gain amplifier amplifying an input signal and a feedback signal by using a voltage gain that is linearly proportional to the gain control voltage, and converting the amplified signal into a predetermined magnitude of a signal; and an offset canceller removing an offset from an output signal of the variable gain amplifier and outputting the offset removed result as the feedback signal. The variable gain amplifier includes a plurality of operational transconductance amplifiers.

In some embodiments, the variable gain amplifiers further include a transconductance controller controlling a transconductance value of the operational transconductance amplifiers as a stable value.

In other embodiments, the transconductance controller is an auto tuning circuit.

In still other embodiments, the transconductance controller is shared with at least one operational transconductance amplifier outside the variable gain amplifier.

In even other embodiments, the variable gain amplifier includes: a gain control unit determining the voltage gain in response to the gain control voltage and amplifying the input signal and the feedback signal by using the voltage gain; and an amplifier amplifying an output of the gain control unit to a predetermined magnitude.

In yet other embodiments, the gain control unit includes: a first transconductor unit cell determining a first gain in response to the gain control voltage and amplifying the input signal and the feedback signal by using the first gain; and a plurality of second transconductor unit cells determining a second gain in response to the gain control voltage and amplifying an output of the first transconductor unit cell by using the second gain.

In further embodiments, the first transconductor unit cell includes: a first operational transconductance amplifier receiving the input signal through a first differential input terminal pair to amplify the input signal by a predetermined gain, and outputting the amplified result to a first differential output terminal pair, the amplified result being fed back to a second differential input terminal pair through a resistor connected to the first differential output terminal pair; and a second operational transconductance amplifier receiving an output signal of the operational transconductance amplifier and the feedback signal from the offset canceller through third and fourth differential input terminal pairs to amplify them by a predetermined gain, and outputting the amplified result through a second differential output terminal pair, the amplified result being fed back to the third differential input terminal pair through a voltage adjustor connected to the second differential output terminal pair.

In still further embodiments, the first and second voltage adjustors include an active resistance element capable of adjusting a resistance value.

In even further embodiments, the first and second voltage adjustors respectively include a plurality of MOS transistors having current paths connected in series, and the gain control voltage adjusts levels of a gate voltage and a body voltage of the MOS transistors.

In yet further embodiments, the gain control unit amplifies the input signal and the feedback signal up to a dynamic range that system specification requires.

In yet further embodiments, the amplifier amplifies an output of the gain control unit up to the magnitude at which digital conversion efficiency is maximized in system specification.

In other embodiments of the present invention, receivers include a transconductor type low pass filter removing signal noise of a channel through filtering; the variable gain amplifier of claim 1 amplifying the filtered signal up to a dynamic range that system specification requires and amplifying the amplified result up to a magnitude at which digital conversion efficiency is maximized; and an analog-to-digital converter converting an output of the variable gain amplifier into a digital signal.

According to the present invention, provided is a CMOS VGA having characteristics of an exponentially linear gain and capable of providing a high linear dynamic range. Additionally, the present invention provides a CMOS VGA having a simple structure, low power consumption, and stable characteristics with respect to process or temperature changes, and a receiver including the same.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

A variable gain amplifier (VGA) of the present invention is configured using an operational transconductance amplifier as a core circuit. In the VGA, a transconductance value Gm is precisely and stably controlled by an auto tuning circuit in a system. Accordingly, in any condition changes (e.g., process, time, and temperature), a transconductance value Gm of an operational transconductance amplifier is not changed in proportion to a reference transconductance absolute value. Due to the above characteristics, overall characteristics and stable performance of the VGA can be maintained. Additionally, the VGA removes a DC-offset from an output signal through an offset canceller. Consequently, a DC-offset occurring in an inner circuit of a receiver system and a dynamic DC-offset caused from a second distortion signal are removed without amplification, such that more accurate and stable output can be obtained. A detailed structure of the VGA and a receiver including the same is as follows.

Figure 1:
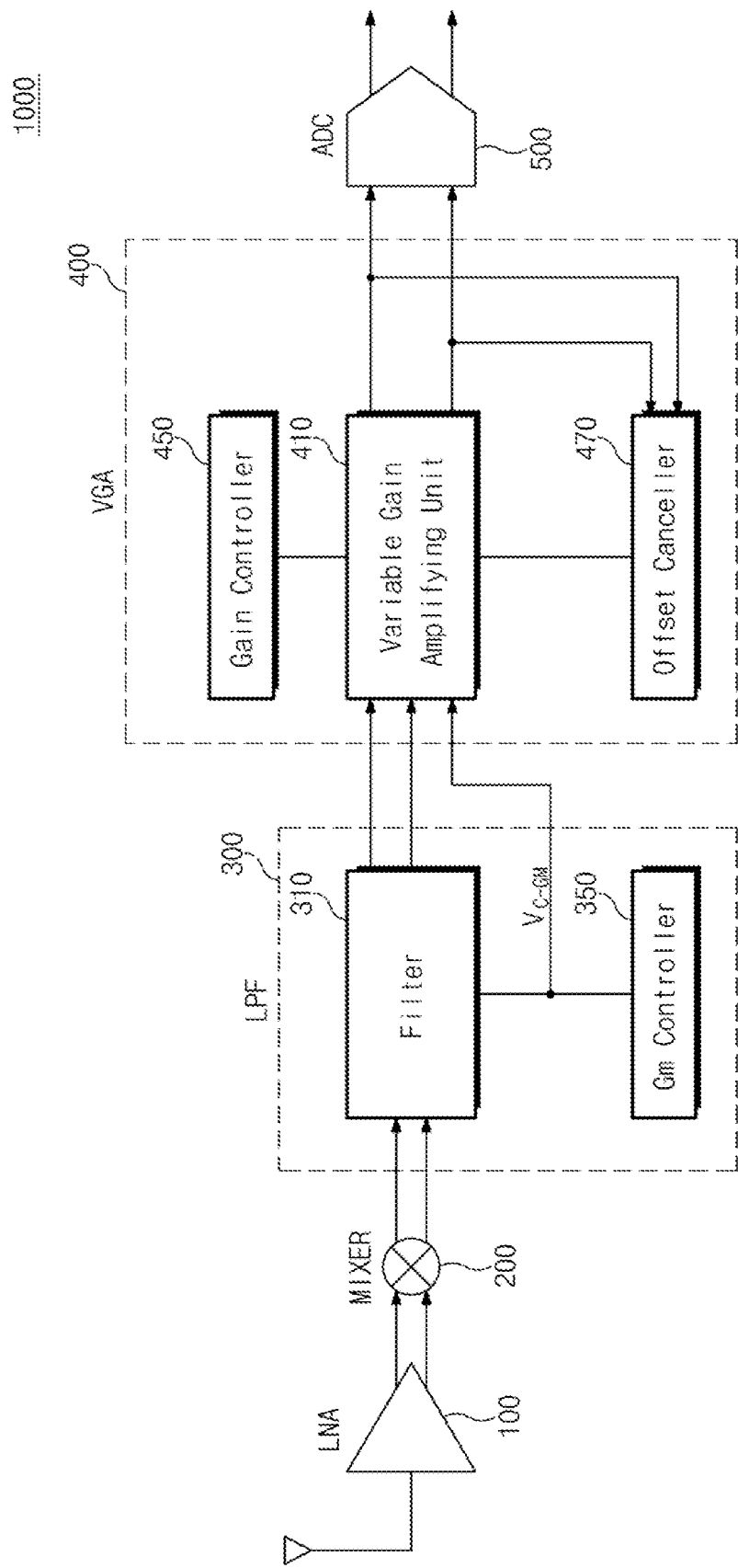
FIG. 1 is an entire block diagram of a VGA and a mobile communication receiver including the same according to the present invention.

FIG. 1 is an entire block diagram of a VGA 400 and a mobile communication receiver 1000 including the same according to the present invention. The mobile communication receiver 1000 of FIG. 1 is a direct conversion receiver (DCR) including the VGA 400 for a receiver of the present invention. FIG. 1 illustrates a block structure of an RF/Analog Front-end for a DCR. However, the receiver 1000 of FIG. 1 is only one example applied for the present invention, and it is apparent to those skilled in the art that the present invention is not limited to the receiver 1000 of FIG. 1.

Referring to FIG. 1, an RF signal received through an antenna in a wireless environment is amplified and modulated through a low noise amplifier (LNA) 100 and a mixer 100. The amplified and modulated RF signal passes through a low-pass filter (LPF) 300 and noise of a channel is removed. The received signal without noise is inputted to the VGA 400. The LPF 300 is disposed prior to the VGA 400 in FIG. 1. However, this is also just one example structure, and according to another structure of a receiver, the VGA 400 may be disposed prior to the LPF 300.

The LPF 300 includes a Gm-C filter 310 performing low-pass filtering and a transconductance controller (Gm controller) 350. The VGA 400 includes a variable gain amplifying unit 410, a gain controller 450, and an offset canceller 470. Although it will be described in more detail, the LPF 300 and the VGA 400 include a transconductance CMOS circuit. Transconductance value Gms of the LPF 300 and the VGA 400, which are a transconductance CMOS circuit, are precisely and stably controlled by the Gm controller 350 in the LPF 300. FIG. 1 illustrates a structure in which the Gm controller 350 is shared with the LPF 300 and the VGA 400. However, this structure can be modified in various forms according to design characteristic of the receiver 1000. For example, the Gm controller 350 may be configured to be disposed in the LPF 300, or in the VGA 400. The Gm controller 350 may be shared with the LPF 300 and the VGA 400, or may be configured to be disposed in each of the LPF 300 and the VGA 400.

The various magnitudes of signals inputted to the VGA 400 are amplified to a gain in a high dynamic range and then is outputted by a control of the gain controller 450. After adjusting this signal to a predetermined magnitude of a signal, which is appropriated for system specification before outputting, the adjusted signal is delivered to an analog-to-digital converter (ADC) 500. That is, an output signal having various magnitudes in the low pass filter 300 is amplified up to a dynamic range for system specification while passing through the VGA 400, and then is converted to a predetermined magnitude of a signal at which digital conversion efficiency of the ADC 500 is maximized. At this point, a gain value of the VGA 400 is controlled using a gain control signal generated through an auto gain control loop.

The analog LPF 300 used in most of mobile communication terminals including the receiver 1000 of FIG. 1 is designed using an operational transconductance amplifier (OTA). A biquad filter and an LC ladder filter using a gyrator are application examples of the operational transconductance amplifier. A transconductance value Gm of the analog LPF 300 designed using the operational transconductance amplifier is precisely and stably controlled by the Gm controller 350, which is an auto tuning circuit designed in a system. As a result, in any condition changes (e.g., process, time, and temperature), a transconductance value Gm of an operational transconductance amplifier is not changed in proportion to a reference transconductance absolute value. Due to the above characteristics, overall characteristics and stable performance of the LPF 300 are maintained.

The LPS 300 and VGA 400 are all very important components in a mobile communication receiver, and are neighboring blocks adjacent to each other. Because the VGA 400 has a high dynamic range and a relatively high gain, its overall performance is sensitively changed according to characteristic changes of a device. Especially, in the structure of the receiver 1000, i.e., the DCR, of FIG. 1, characteristics of the receiver 1000 can be affected by second harmonic distortion.

To prevent the above limitations, according to the present invention, characteristics of the operational transconductance amplifier providing a stable performance are applied to all the LPF 300 and the VGA 400. According to this structure, performance of the receiver 1000 can be stably maintained without characteristic deterioration during process, temperature, and time changes. Furthermore, according to the present invention, because the VGA 400 is designed through a transconductor type CMOS circuit, input/output characteristics can guarantee linearity up to an extensively broad range, compared to another amplifier without the transconductor type CMOS circuit. Additionally, compared to the other amplifiers, the VGA 400 of the present invention has low power consumption and low distortion characteristics. Additionally, as illustrated in FIG. 1, the adjacent LPF 300 and VGA 400 in the receiver 1000 share the Gm controller 350 to control a transconductance value Gm, so that an overlapping circuit can be prevented. Due to a continuous disposition of the transconductance CMOS circuit constituting the LPF 300 and the VGA 400, a structure becomes simpler, and a design area can be effectively reduced.

Figure 2:
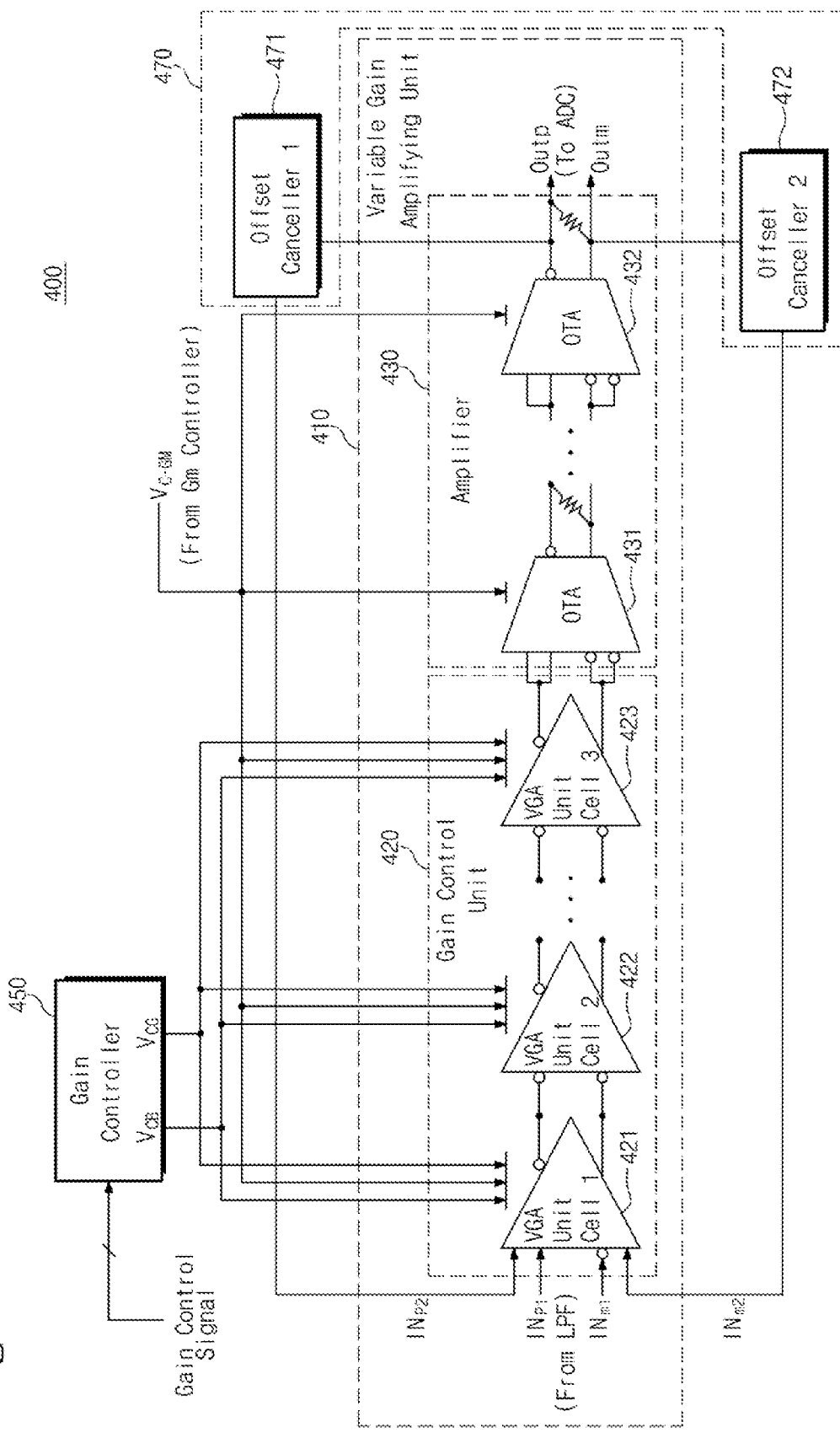
FIG. 2 is a detailed block diagram of VGA of FIG. 1 according to the present invention.

FIG. 2 is a detailed block diagram of the VGA 400 of FIG. 1 according to the present invention.

Referring to FIG. 2, the VGA 400 includes a variable gain amplifying unit 410, a gain controller 450, and an offset canceller 470. The gain controller 450 generates gain control voltages $V_{CB}$ and $V_{CG}$ controlling a gain value of the variable gain amplifying unit 410 in response to a gain control signal generated through an auto gain control loop. The offset canceller 470 includes a first offset canceller 471 and a second offset canceller 472. The first and second offset cancellers 471 and 472 remove a DC-offset in an output signal of the variable gain amplifying unit 410 through an amplifying loop. At this point, the first and second offset cancellers 471 and 472 and the variable gain amplifying unit 410 are connected to configure a negative feedback. A method of removing a DC-offset in the first and second offset cancellers 471 and 472 includes, for example, a low pass filtering method using a resistor, a capacitor, and operational transconductance amplifiers.

The variable gain amplifying unit 410 includes a gain control unit 420 and an amplifier 430. The gain control unit 420 receives variable magnitudes of signals from the LPF 300 and amplifies the signals by a gain of a high dynamic range that satisfying system specification. The result signal amplified by the gain control unit 420 is inputted to the amplifier 430, and then converted into a predetermined magnitude of a signal at which digital conversion efficiency is maximized in system specification. The output of the amplifier 430 is fed back to the gain control unit 430 after removing a DC-offset through the first and second offset cancellers 471 and 472. The output signal without the DC-offset is outputted to the ADC 500 through the gain control unit 420 and the amplifier 430.

The gain control unit 420 changes a gain in response to gain control voltages $V_{CB}$ and $V_{CG}$ generated from the gain controller 450. As the result of changing the gain, a voltage gain of a decibel (dB) unit, which is linearly proportional to the gain control voltages $V_{CB}$ and $V_{CG}$, is provided. Although it will be described in more detail later, $V_{CG}$ generated from the gain controller 450 is used to control a gate voltage $V_G$ of metal oxide semiconductor (MOS) resistors constituting the gain control unit 420, and $V_{CB}$ is used to control a body voltage $V_B$ of MOS resistors constituting the gain control unit 420.

Looking at a specific structure of the gain control unit 420, the gain control unit 420 includes one first VGA unit cell 421 and a plurality of second VGA unit cells 422 and 423. FIG. 2 illustrates the first and second VGS unit cells 421 to 423 based on a structure of Gm-VGA, which is disclosed in Korean Pat. Registration No. 648379 and U.S. Pat. Publication No. US200070126501A1. Basic operations of the first and second VGA unit cells 421 to 423 follow the above patent official reports. Accordingly, a part of specific operations of the VGA unit cells 421 to 423 is not described here. However, the first and second VGA unit cells 421 to 423 of the present invention are newly configured to be appropriate to a VGA for a receiver in a mobile communication system, and may be replaced with other forms of VGA unit cells.

The first VGA unit cell 421 receives differential input signals $IN_{P1}$ and $IN_{m1}$ from the LPF 300 and feedback signals $IN_{P2}$ and $IN_{m2}$ from the first and second offset canceller 471 and 472 to amplify the signals by a predetermined gain and then output the signals. The gain is adjusted by gain control voltages $V_{CB}$ and $V_{CG}$ generated from the gain controller 450. The feedback signals $IN_{P2}$ and $IN_{m2}$ provided from the first and second offset cancellers 471 and 472 are output feedback signals for removing a DC-offset.

For example, the second VGA unit cell 422 receives and amplifies the output of the VGA cell 421 by a predetermined gain, and then outputs the amplified result to the next VGA unit cell 423. The gain is adjusted by the gain control voltages $V_{CB}$ and $V_{CG}$ generated from the gain controller 450. These input/output operations are continuously performed in the second VGA unit cells 422 and 423 connected in series. The number of the first and the second VGA unit cells 421 to 423 is determined by a dynamic range that a system requires. For example, when each VGA unit cell has a dB-linear dynamic range of several tens of dB, to satisfy a dynamic range that a system requires, the number of VGS unit cells is obtained by dividing the dynamic range that the system requires by the dynamic range that each VGA unit cell has. For example, because a variable gain range of 70 dB is required in a wideband code division multiple access (WCDMA) terminal, if each VGA unit cell has a dynamic range of 18 dB, the total four VGA unit cells need to be continuously connected in series in order to satisfy system specification. As the number of VGA unit cells 421 to 423 in the gain control unit 420 increases, the removing rate of a DC-offset increases.

On the other hand, FIG. 2 illustrates a structure in which the gain control unit 420 is connected to the amplifier 430 in the next step. However, this is just one embodiment that the present invention is applied, and connection between the gain control unit 420 and the amplifier 430 can have various forms through modifications and enhancements. For example, the amplifier 430 can be connected to the gain control unit 420 in the next stage, and also the gain control unit 420 can be disposed in the amplifier 430.

Figure 3:
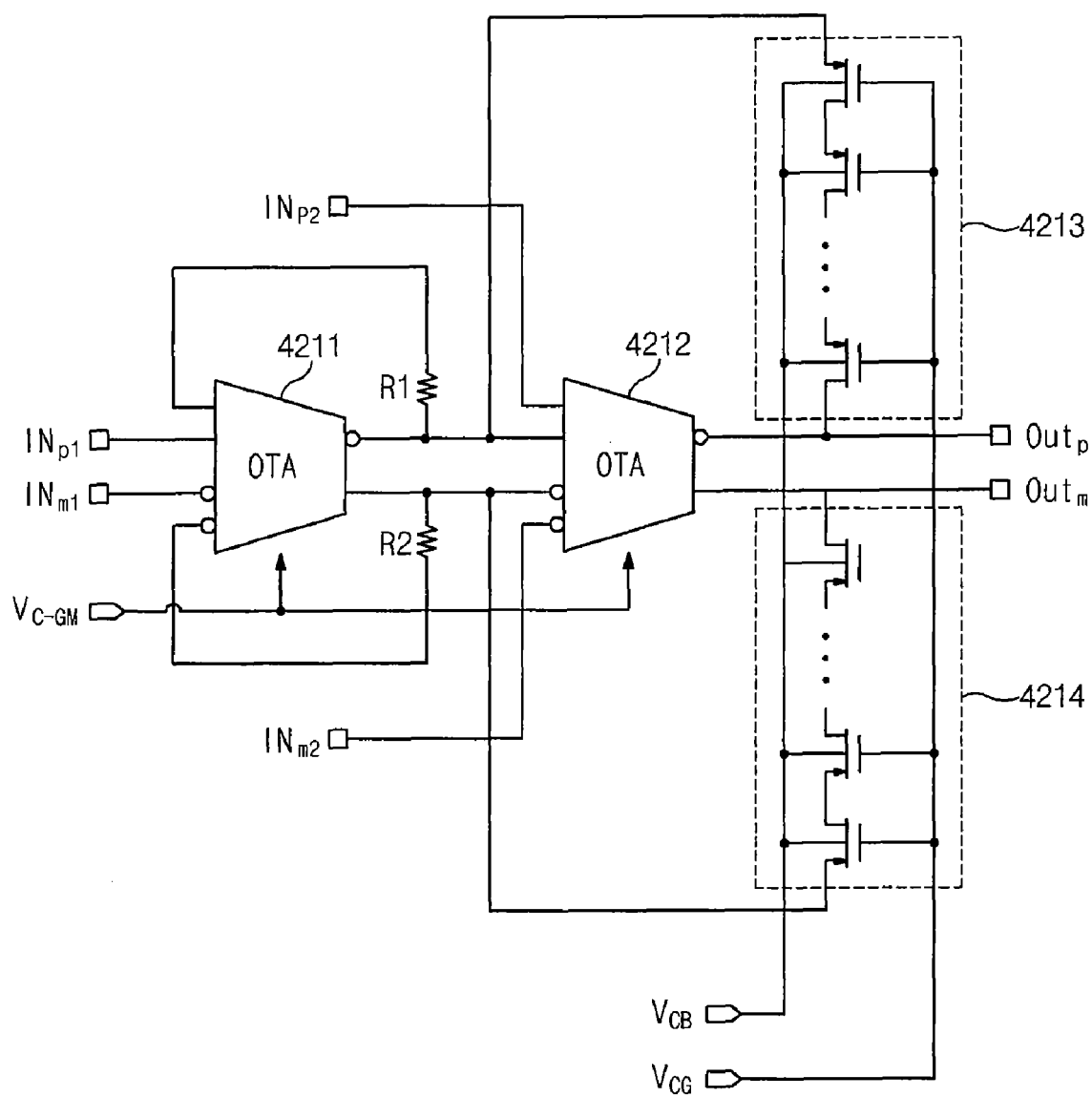
FIG. 3 is a circuit diagram of a first VGA unit cell of FIG. 2.
Figure 4:
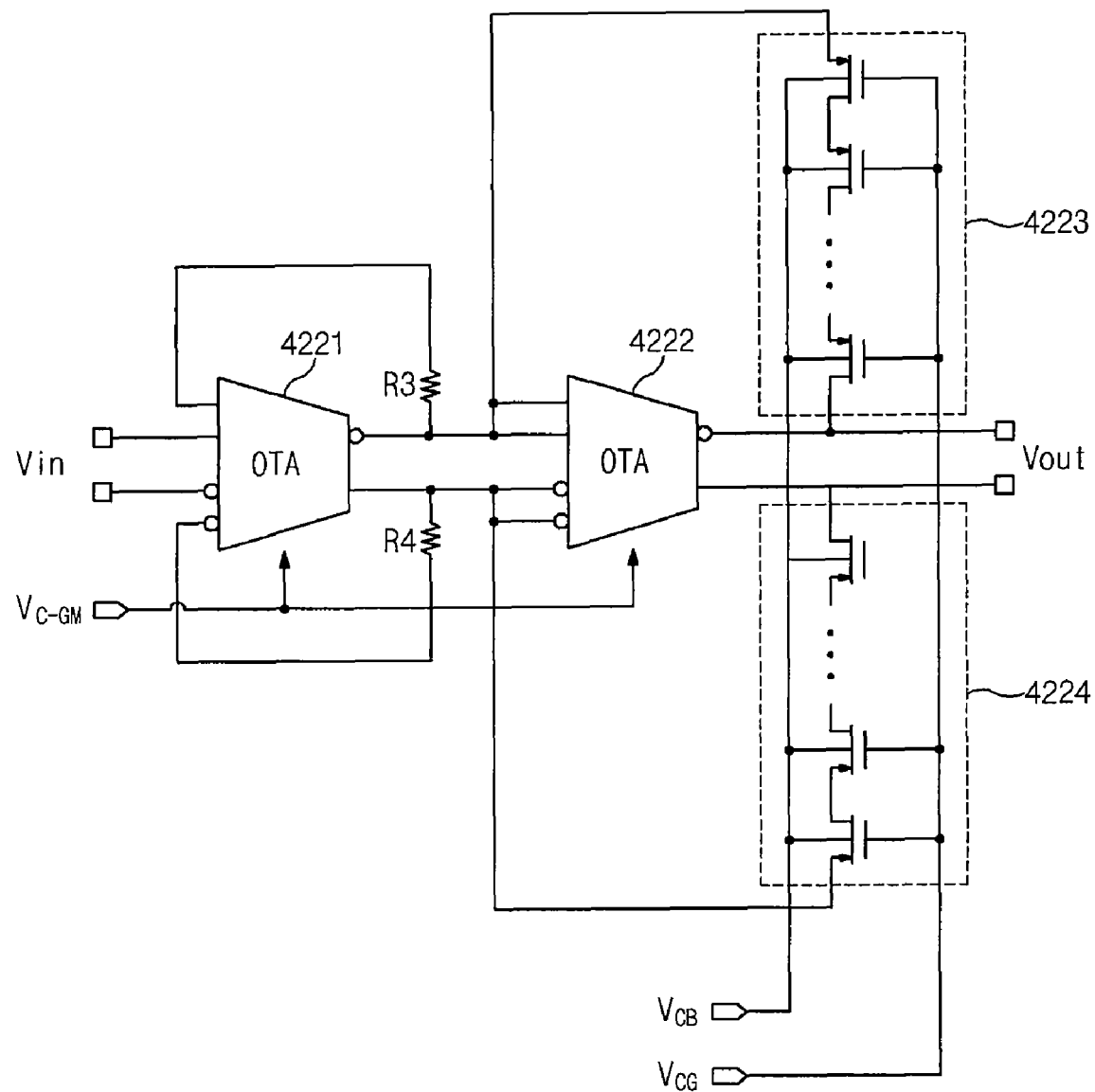
FIG. 4 is a circuit diagram of a second VGA unit cell of FIG. 2.

FIG. 3 is a circuit diagram of the first VGA unit cell 421 of FIG. 2. FIG. 4 is a circuit diagram of the second VGA unit cell 422 of FIG. 2.

Referring to FIG. 3, the first VGA unit cell 421 includes first and second operational transconductance amplifiers 4211 and 4212 (shown as OTA) having the same characteristic. The first operational transconductance amplifier 4211 receives differential input signals $IN_{p1}$ and $IN_{m1}$ from the LPF 300 through a first differential input terminal pair, and amplifies the input signals $IN_{p1}$ and $IN_{m1}$ by a predetermined gain. The amplified result is outputted through the first differential output terminal pair. First and second resistors are respectively connected to the first differential input terminal pair and the first differential output terminal pair. A differential output signal generated from the first operational transconductance amplifier 4211 is negative fed back through the first and second resistors R1 and R2 and is inputted to the first differential input terminal pair of the first operational transconductance amplifier 4211. At this point, the resistors R1 and R2 boost a bandwidth. The second operational transconductance amplifier 4212 receives an output of the first operational transconductance amplifier 4211 through a third differential input terminal pair, and receives feedback signals $IN_{p2}$ and $IN_{m2}$ provided from the first and second offset cancellers 471 and 472 through a fourth differential input terminal pair. The second operational transconductance amplifier 4212 amplifies an output of the first operational transconductance amplifier (OTA) 4211 and the feedback signals $IN_{p2}$ and $IN_{m2}$ by a predetermined gain in response to the gain control voltages $V_{CB}$ and $V_{CG}$ generated from the gain controller 450. The amplification result of the second operational transconductance amplifier 4212 is provided to a second differential output terminal pair. First and second voltage adjusters 4213 and 4214 are respectively connected between a third differential input terminal pair and a second differential output terminal pair. A differential output signal generated from the second operational transconductance amplifier 4212 is negative fed back through the first and second voltage adjusters 4213 and 4214, and then is inputted into a third differential input terminal pair of the second operational transconductance amplifier 4212.

The first and second voltage adjustors 4213 and 4214 may include active resistance component capable of adjusting a resistance value and may include MOS transistors (i.e., MOS resistors) of FIG. 3. That is, according to the present invention, when a drain-source voltage Vds of MOS transistors in the first and second voltage adjustors 4213 and 4214 is drastically changed, a plurality of MOS transistors are continuously connected to prevent signal distortion caused by a resistance value change. Here, current paths of the MOS transistors are connected in series.

According to the present invention, a gate voltage $V_G$ and a body voltage $V_B$ of MOS resistors operating in a triode region are controlled using gain control voltages $V_{CG}$ and $V_{CB}$ generated from the gain controller 450, such that resistance values of the first and second voltage adjustors 4213 and 4214 are adjusted. According to resistance values of the first and second resistors R1 and R2 and the first and second voltage adjustors 4213 and 4214, a gain of the first VGA unit cell 421 is determined.

On the other hand, transconductance control voltage VCGM generated from the Gm controller 350 is inputted to the first and second operational transconductance amplifiers 4211 and 4212, such that transconductance values Gm of the first and second operational transconductance amplifiers 4211 and 4212 are adjusted to be stable. As a result, the first VGA unit cell 421 stably maintains performance without characteristic deterioration during process, temperature, and time changes.

Referring to FIG. 4, the second VGA unit cell 422 includes first and second operational transconductance amplifiers 4221 and 4222 having the same characteristics. Third and fourth resistors R3 and R4 are connected to the first operational transconductance amplifier (OTA) 4221, and first and second voltage adjustors 4223 and 4224 are connected to the second operational transconductance amplifier 4222. As illustrated in FIGS. 3 and 4, except that the second operational transconductance amplifier 4212 of the first VGA unit cell 421 receives feedback signals $IN_{p2}$ and $IN_{m2}$ from the first and second offset cancellers 471 and 472, the first VGA unit cell 421 has a structure identical to that of the second VGA unit 422. Therefore, its overlapping description for the second VGA unit cell 422 will be omitted for conciseness.

Referring to FIG. 2 again, the amplifier 430 includes a plurality of operational transconductance amplifiers 431 and 432 connected in series. A basic structure of the operational transconductance amplifiers 431 and 432 (OTA) is substantially identical to that of operational transconductance amplifiers 421 to 423 constituting the gain control unit 420 and that of operational transconductance amplifiers (not shown) constituting a filter of the LPF 300. A gain of the amplifier 430 is determined by the magnitude of resistance component of an output load connected between differential output terminals of the operational transconductance amplifiers 431 and 432. An additional signal is not provided to the amplifier 430 in order to control a voltage gain. A gain of one operational transconductance amplifier provides an ideal gain of more than 70 dB. Therefore, a sufficient required gain can be obtained by only using the small number of operational transconductance amplifiers. Accordingly, by only considering frequency characteristic, a resistance value and the number of operational transconductance amplifiers can be determined in the amplifier 430.

Transconductance value Gms of the operational transconductance amplifiers 431 and 432 are controlled to be precise and stable by a control of the Gm controller 350. The Gm controller 350 controls transconductance value Gms of operational transconductance amplifiers 421, 422, and 423 constituting the gain control unit 420, the operational transconductance amplifiers 431 and 432 in the amplifier 430, and an operational transconductance amplifier (not shown) constituting a filter 310 of the LPF 300. The Gm controller 350 includes an auto tuning circuit to adjust the transconductance value Gm.

Firstly, a variable amplified signal in the gain control unit 420 is inputted to the amplifier 430, and then amplified again. An output of the amplifier 430 is amplified to be fixed with a predetermined magnitude. That is, before providing a signal to the ADC 500, which is amplified to a dynamic range in the gain control unit 420 of the previous stage, the signal is converted into a predetermined magnitude at which digital conversion efficiency of the ADC 500 is maximized.

Figure 5:
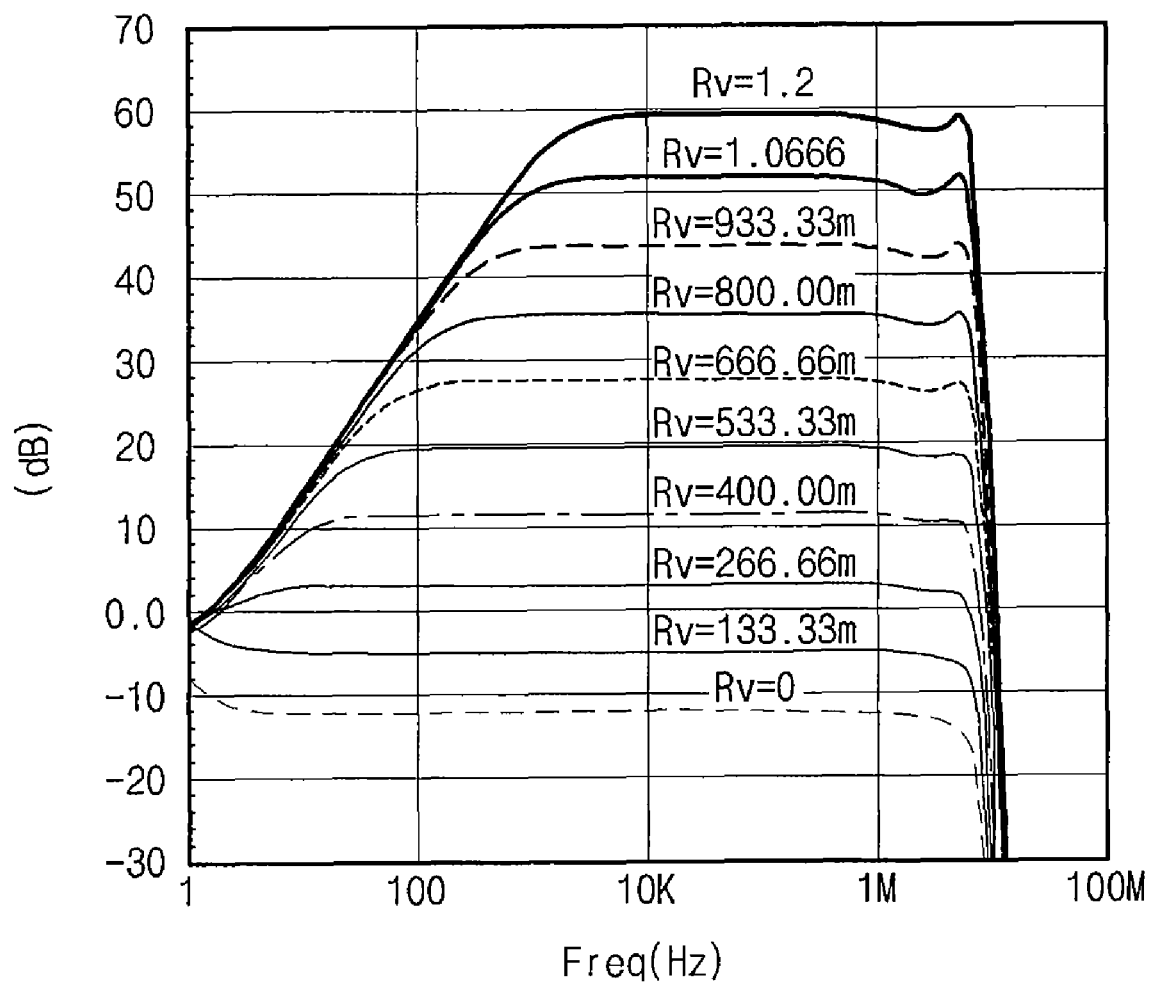
FIG. 5 is a graph illustrating frequency characteristic of a transconductor type VGA according to the present invention.

FIG. 5 is a graph illustrating frequency characteristic of the transconductor type VGA 400 according to the present invention.

Referring to the simulation result, an overall gain characteristic of the VGA 400 is changed according to a gain control signal generated through an auto gain control loop. Additionally, due to a DC-offset cancelling operation of the offset canceller 470, a minus gain is obtained at about DC, and a cutoff point does not exceed several kHz at the maximum gain. In this case, a 3 dB bandwidth needs to be largely designed by considering channel filtering of the LPF 300.

Figure 6:
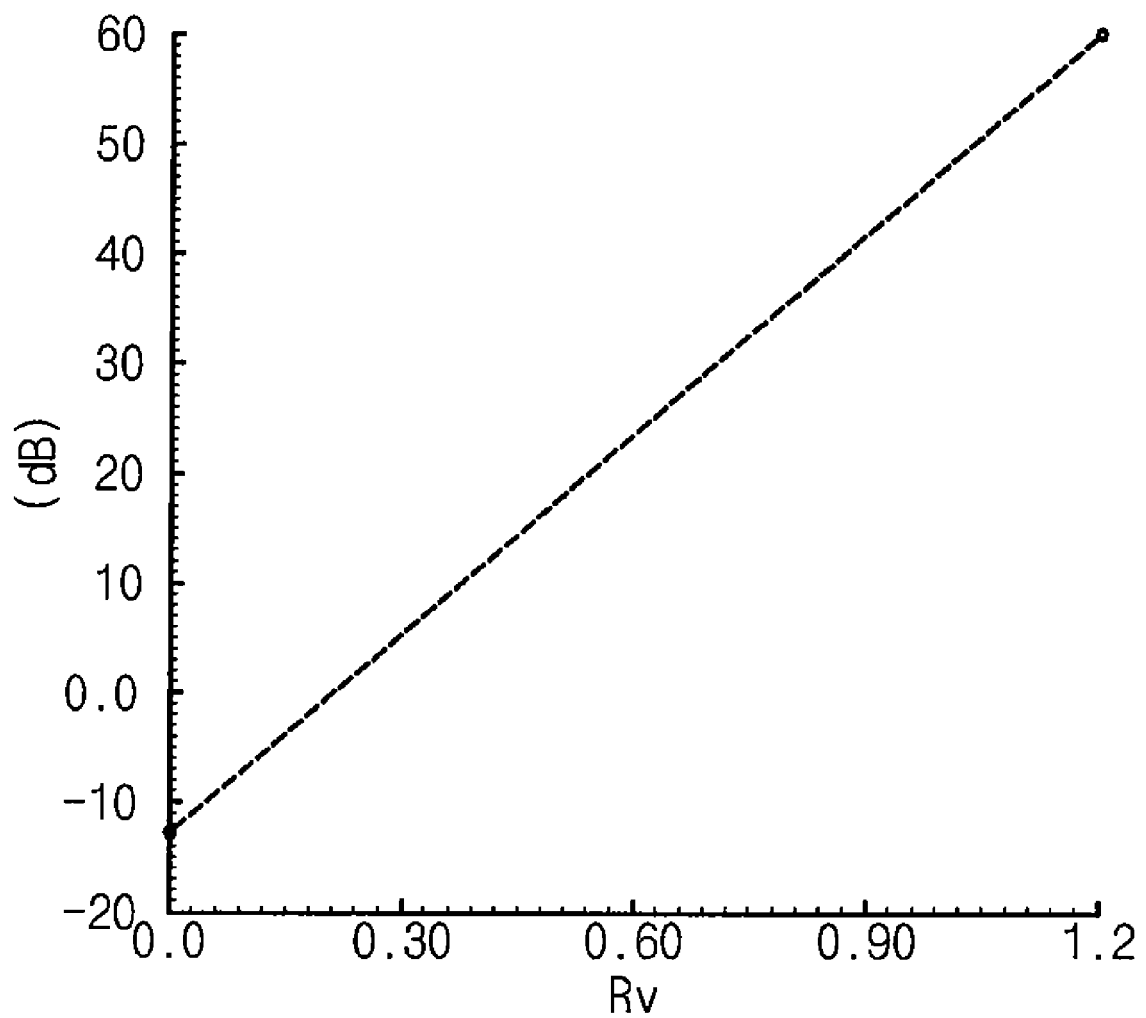
FIG. 6 is a graph illustrating a dB gain of a transconductor type VGA according to the present invention.

FIG. 6 is a graph illustrating a dB gain of the transconductor type VGA 400 according to the present invention. FIG. 6 illustrates a dB gain of an output of the VGA 400 according to a gain control voltage at a 1 MHz offset. Referring to FIG. 6, the VGA 400 has a linear dB gain characteristic of more than 70 dB with respect to a gain control voltage.

Figure 7:
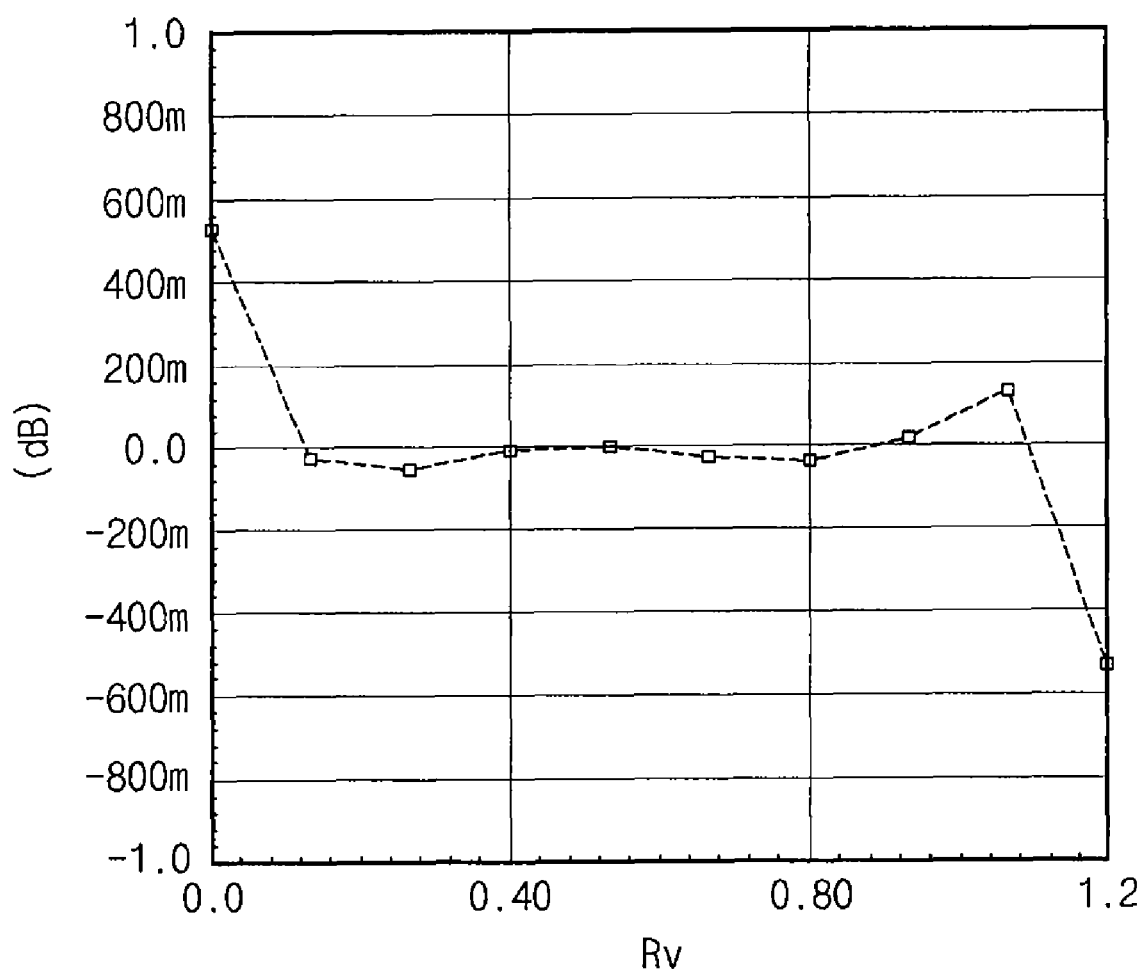
FIG. 7 is a graph illustrating dB-linear error characteristic of a transconductor type VGA according to the present invention.

FIG. 7 is a graph illustrating dB-linear error characteristic of a transconductor type VGA according to the present invention. Referring to FIG. 7, the transconductor type VGA 400 includes a linear error of below 0.5 dB within a gain adjustment range of more than 70 dB. As illustrated in FIGS. 5 through 7, the VGA 400 of the present invention can remove a DC offset through a simpler structure, and provides exponentially linear gain characteristic having a high dynamic range with respect to a adjust voltage.

Additionally, according to the VGA 400 of the present invention, because an operational transconductance amplifier is used as a core circuit, stable performance can be maintained without characteristic deterioration during process, temperature, and time changes. Because the VGA 400 is configured through a transconductor, low power consumption can be obtained. Furthermore, because the VGA 400 can be connected to the LPF 300, design period shortening, efficient design layout, and highly accurate control can be obtained. In this case, the VGA 400 of the present invention does not require an additional Gm controller for adjusting a transconductance value Gm and shares the LPF 300 and the controller 350. Accordingly, a control and a circuit structure for a transconductance value Gm become simple.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A variable gain amplifier comprising:
   a gain controller configured to generate a gain control voltage;
   a variable gain amplifying unit configured to amplify an input signal and a feedback signal by using a voltage gain that is proportional to the gain control voltage, and convert the amplified signal into a predetermined magnitude; and
   an offset canceller configured to remove an offset from an output signal of the variable gain amplifying unit and output the offset removed result as the feedback signal, wherein the variable gain amplifying unit comprises:
      a gain control unit configured to determine the voltage gain in response to the gain control voltage and amplify the input signal and the feedback signal by using the voltage gain; and
      an amplifier configured to amplify an output of the gain control unit to the predetermined magnitude.

2. The variable gain amplifier of claim 1, further comprising a transconductance controller configured to control a transconductance value of the variable gain amplifying unit as a stable value.

3. The variable gain amplifier of claim 2, wherein the transconductance controller is an auto tuning circuit.

4. The variable gain amplifier of claim 2, wherein the transconductance controller is shared with at least one operational transconductance amplifier outside the variable gain amplifier.

5. The variable gain amplifier of claim 1, wherein the gain control unit comprises:
   a first transconductor unit cell configured to determine a first gain in response to the gain control voltage and amplify the input signal and the feedback signal by using the first gain; and
   a plurality of second transconductor unit cells configured to determine a second gain in response to the gain control voltage and amplify an output of the first transconductor unit cell by using the second gain.

6. The variable gain amplifier of claim 5, wherein the first transconductor unit cell comprises:
   a first operational transconductance amplifier configured to receive the input signal through a first differential input terminal pair to amplify the input signal by a predetermined gain, and output an amplified input signal to a first differential output terminal pair, the amplified input signal being fed back to a second differential input terminal pair through a resistor connected to the first differential output terminal pair; and
   a second operational transconductance amplifier configured to receive an output signal of the first operational transconductance amplifier and the feedback signal from the offset canceller through third and fourth differential input terminal pairs to amplify them by a predetermined gain, and output an amplified result through a second differential output terminal pair, the amplified result being fed back to the third differential input terminal pair through first and second voltage adjustors connected to the second differential output terminal pair.

7. The variable gain amplifier of claim 6, wherein each of the first and second voltage adjustors comprises an active resistance element capable of adjusting a resistance value.

8. The variable gain amplifier of claim 6, wherein each of the first and second voltage adjustors comprises a plurality of metal oxide semiconductor (MOS) transistors having current paths connected in series, and the gain control voltage adjusts levels of a gate voltage and a body voltage of the MOS transistors.

9. The variable gain amplifier of claim 1, wherein the gain control unit is configured to amplify the input signal and the feedback signal up to a dynamic range that system specification requires.

10. The variable gain amplifier of claim 1, wherein the amplifier is configured to amplify an output of the gain control unit up to a magnitude at which digital conversion efficiency is maximized in system specification.

11. A receiver comprising:
   a transconductor type low pass filter configured to remove signal noise of a channel through filtering and output a filtered signal;
   a variable gain amplifier configured to amplify the filtered signal up to a dynamic range that system specification requires and amplify an amplified result up to a magnitude at which digital conversion efficiency is maximized; and
   an analog-to-digital converter configured to convert an output of the variable gain amplifier into a digital signal, wherein the variable gain amplifier comprises:
      a gain controller configured to generate a gain control voltage;
      a variable gain amplifying unit configured to amplify an input signal and a feedback signal by using a voltage gain that is proportional to the gain control voltage, and convert the amplified signal into a predetermined magnitude of a signal; and
      an offset canceller configured to remove an offset from an output signal of the variable gain amplifying unit and output the offset removed result as the feedback signal, and
      wherein the variable gain amplifying unit comprises:
         a gain control unit configured to determine the voltage gain in response to the gain control voltage and amplify the input signal and the feedback signal by using the voltage gain; and
         an amplifier configured to amplify an output of the gain control unit to the predetermined magnitude.

* * * * *